(12) United States Patent  (10) Patent No.: US 8,149,585 B2
Kawano  (45) Date of Patent: Apr. 3, 2012

(54) INTERPOSER AND ELECTRONIC DEVICE USING THE SAME

(75) Inventor: Shuichi Kawano, Ogaki (JP)

(73) Assignee: Ibiden Co., Ltd., Ogaki (JP)

(\*) Notice: Subject to any disclaimer, the term of this patent is extended or adjusted under 35 U.S.C. 154(b) by 51 days.

(21) Appl. No.: 11/860,132

(22) Filed: Sep. 24, 2007

(65) Prior Publication Data

US 2008/0142976 A1   Jun. 19, 2008

Related U.S. Application Data

(63) Continuation-in-part of application No. 11/491,288, filed on Jul. 24, 2006, now abandoned.

(51) Int. Cl.
*H05K 1/16* (2006.01)

(52) U.S. Cl. .......................... 361/766; 361/782

(58) Field of Classification Search .................. 361/760, 361/766, 771, 782, 793, 795, 803, 804; 257/690–692, 700, 701, 703, 724; 174/255, 174/262

See application file for complete search history.

(56) References Cited

U.S. PATENT DOCUMENTS

| | | | | |
|---|---|---|---|---|
| 5,177,670 A | * | 1/1993 | Shinohara et al. | 361/738 |
| 6,052,287 A | * | 4/2000 | Palmer et al. | 361/767 |
| 6,507,497 B2 | * | 1/2003 | Mashino | 361/767 |
| 6,794,729 B2 | | 9/2004 | Mori et al. | |
| 7,046,501 B2 | * | 5/2006 | Tsuji | 361/306.2 |
| 7,378,601 B2 | * | 5/2008 | Hsu et al. | 174/262 |
| 7,388,293 B2 | * | 6/2008 | Fukase et al. | 257/774 |
| 7,463,492 B2 | * | 12/2008 | Radhakrishnan et al. | 361/782 |
| 2003/0198033 A1 | * | 10/2003 | Panella et al. | 361/760 |
| 2004/0014313 A1 | | 1/2004 | Farooq et al. | |

FOREIGN PATENT DOCUMENTS

| | | |
|---|---|---|
| JP | 2000-353875 | 12/2000 |
| JP | 2001-326305 | 11/2001 |
| JP | 2004-56145 | 2/2004 |

OTHER PUBLICATIONS

U.S. Appl. No. 11/969,606, filed Jan. 4, 2008, Kawano.

\* cited by examiner

*Primary Examiner* — Yuriy Semenenko

(74) *Attorney, Agent, or Firm* — Oblon, Spivak, McClelland, Maier & Neustadt, L.L.P.

(57) ABSTRACT

Means for Solution: This interposer (10) comprises the silicon substrate (12), a plurality of through-hole conductors (20) formed on the above-described silicon substrate, and a capacitor (15) formed with the upper electrodes (14) and the lower electrodes (18) formed by extending the land portions of the above-described through-hole conductors and the dielectric layer (16) formed between the both electrodes. The rewiring layers (23-1, 23-2) formed as desired are formed on the layers other than the above-described capacitor layer.

20 Claims, 12 Drawing Sheets

US 8,149,585 B2

INTERPOSER AND ELECTRONIC DEVICE USING THE SAME

TECHNICAL FIELD

The present invention relates to an interposer and an electronic device using the same, and, more specifically, to an interposer interposed between a semiconductor chip and a package substrate as well as to an electronic device composed of a combination of the conductor chip, the interposer, and the package substrate.

There has conventionally been known an interposer as a printed wiring board for carrying out rewiring between a semiconductor chip and a package substrate. An interposer is mainly a rewiring device used to mutually connect a conductor circuit having an ultra dense pitch (e.g., 50 μm) of a semiconductor chip and a conductor circuit having a more coarse pitch (e.g., 150 μm) of a package substrate (also referred to as a "mounting substrate").

BACKGROUND TECHNOLOGY

Patent Document 1: Laid-Open Patent No. 2001-326305 "Interposer for Semiconductor Device, Method of Manufacturing the Same, and Semiconductor Device"(Laid-open, unexamined, Nov. 22, 2001)

The above-described patent document discloses an interposer wherein a capacitor and a wiring pattern are formed on an insulating substrate.

DISCLOSURE OF THE INVENTION

Problem to be Solved by the Invention

The studies undertaken subsequently by the present inventor found that various problems would occur when a capacitor and a rewiring layer are formed together on an interposer as described in the patent document 1.

Means to Solve the Problem

Accordingly, the purpose of the present invention is to provide a novel interposer and an electronic device using it.

In view of the above-described purpose, the interposer pertaining to the present invention comprises a capacitor formed on nearly the entire surface of the substrate.

Further, in the above-described interposer, the above-described capacitor comprises a lower electrodes having opening portions, a dielectric layer formed on the above-described lower electrodes, and upper electrodes formed on the above-described dielectric layer and having opening portions, and the above-describe interposer further has through-hole conductors for power supply running through the above-described substrate and electrically connected to the power supply electrodes of the IC chip, through-hole lands for power supply connected to the above-described through-hole conductors for power supply and formed inside the opening portions of the above-described lower electrodes, through-hole conductors for ground running through the above-described substrate and electrically connected to the ground electrodes of the IC chip, via lands for ground electrically connected to the above-described through holes for ground and formed inside the opening portions of the above-described upper electrodes, through-hole conductors for signal running through the above-described substrate and electrically connected to the signal electrodes of the IC chip, through-hole lands connected to the above-described through-hole conductors for signal and formed on the above-described substrate, via conductors for ground connecting the above-described via lands for ground and the above-described lower electrodes and formed on the above-described dielectric layer, and via conductors for power supply connecting the above-described through-hole lands for power supply and the upper electrodes and formed on the above-described dielectric layer, and the above-described through-hole conductors for signal may be formed in the regions other than the regions where the above-described through-hole conductors for ground and the above-described through-hole conductors for power supply are formed.

Further, in the above-described interposer, the above-described capacitor comprises lower electrodes having opening portions, a dielectric layer formed on the above-described lower electrodes, and upper electrodes formed on the above-described dielectric layer and having opening portions, and the above-describe interposer further has through-hole conductors for ground running through the above-described substrate and electrically connected to the ground electrodes of the IC chip, through-hole lands for ground connected to the above-described through-hole conductors for ground and formed inside the opening portions of the above-described lower electrodes, through-hole conductors for power supply running through the above-described substrate and electrically connected to the power supply electrodes of the IC chip, via lands for power supply electrically connected to the above-described through hole conductors for power supply and formed inside the opening portions of the above-described upper electrodes, through-hole conductors for signal running through the above-described substrate and electrically connected to the signal electrodes of the IC chip, through-hole lands for signal connected to the above-described through-hole conductors for signal and formed on the above-described substrate, via conductors for power supply connecting the above-described via lands for power supply and the above-described lower electrodes and formed on the above-described dielectric layer, and via conductors for ground connecting the above-described through-hole lands for ground and the upper electrodes and formed on the above-described dielectric layer, and the above-described through-hole conductors for signal may be formed in the regions other than the regions where the above-described through-hole conductors for ground and the above-described through-hole conductors for power supply are formed.

Further, an electronic device pertaining to the present invention comprises an IC chip, a package substrate, an interposer interposed between the above-described IC chip and the above-described package substrate and electrically connected to the both separately and as set forth in claims 1-2, and the above-described interposer provides a capacitor.

Further, the method of manufacturing an interposer pertaining to the present invention is set forth such that a silicon substrate being prepared, a capacitor comprising lower electrodes, a dielectric layer, and upper electrodes is formed on nearly the entire face of one face of the above-described silicon substrate, that through holes are formed into said silicon substrate from the other face of the above-described silicon substrate, that through-hole conductors are formed inside the above-described through holes, that some of the above-described through-hole conductors are electrically connected to the above-described lower electrodes, and that some of the remainder of the above-described through-hole conductors are connected to the above-described upper electrodes via via-hole conductors formed on the above-described dielectric layer.

Further, the method of manufacturing an electronic device pertaining to the present invention is a method set forth such that an interposer manufactured in accordance with the above-described method being prepared, an IC chip is electrically connected to one face of the above-described interposer and a package is electrically connected to the other face of the above-described interposer.

EFFECT OF THE INVENTION

The present invention can provide a novel interposer and an electronic device using it.

BRIEF DESCRIPTION OF THE DRAWINGS

FIG. 1 is a sectional view illustrating the feature of an interposer pertaining to the present embodiment.

FIG. 2 is a view of a portion of the capacitor formed on the interposer illustrated in FIG. 1 as viewed from the lower electrodes side.

FIG. 3 is a sectional view illustrating the feature of an interposer pertaining to another embodiment.

FIG. 4 is a sectional view illustrating the constitution of an electronic device using an interposer.

FIG. 5 is a sectional view illustrating the constitution of an electronic device using another interposer.

FIG. 6A through FIG. 6M are views illustrating an example of the manufacturing process of an interposer illustrated in FIG. 5, generally speaking, a step for forming a capacitor on a silicon substrate.

FIG. 7A through FIG. 7N are views illustrating an example of the manufacturing process of an interposer illustrated in FIG. 5, generally speaking, a step for forming a rewiring layer on the upper face of this capacitor.

FIG. 8A through FIG. 8J are views illustrating an example of the manufacturing process of an interposer illustrated in FIG. 5, generally speaking, a step for forming through-hole conductors on a silicon substrate.

BEST EMBODIMENT TO PRACTICE THE INVENTION

Figure 1:
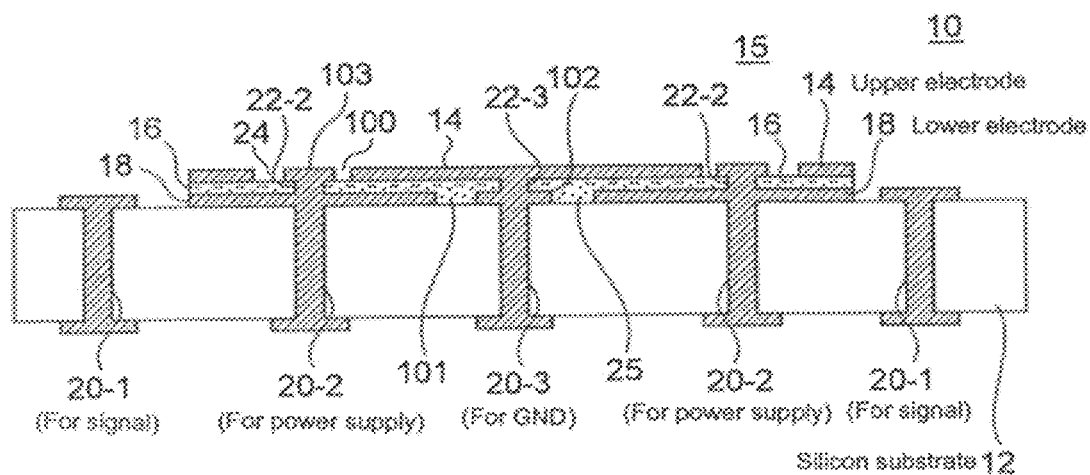
FIG. 1.

The following is a brief description of the embodiments of a novel interposer and an electronic device using this pertaining to the present invention with reference to the accompanying drawings. It should be understood that these embodiments are for the illustrative purpose and that the present invention is not limited thereto. In addition, the same components are denoted by the same reference numerals in the drawings, and duplicate explanations are omitted.

Interposer:

FIG. 1 is a sectional view illustrating the feature of an interposer 10 pertaining to the present embodiment. The interposer 10 comprises through-hole conductors 20-1, 20-2, 20-3 formed on the silicon substrate 12 and via conductors 22-2, 22-3 formed on the dielectric layer 16. The through-hole conductors 20-1 through 20-3 are connected to either through-hole lands 102 formed on the substrate surface or to the lower electrodes 18. The via conductors 22-2 through 22-3 are connected to the via lands 103 formed on the dielectric layer 16. The through-hole conductors for power supply 20-2 and the via conductors for power supply 22-2 are longitudinally connected, and, likewise, the through-hole conductors for ground 20-3 and the via conductors for ground 22-3 as well as the through-hole conductors for signal 20-1 and the via conductors for signal 22-1 (see FIG. 3) are longitudinally connected, respectively. Therefore, in the present application document, the through holes and the via holes being longitudinally connected may generally be referred to with a general term such as "through-hole conductors and via conductors 20-1, 22-1." The interposer 10 comprises this silicon substrate 12 and a capacitor 15 comprising lower electrodes 18 having opening portions 101, a dielectric layer 16, and upper electrodes 14 having the opening portions 100.

The clearances 25, 24 herein indicate the insulating areas between through-hole lands 102 and via lands 103, respectively, and the opening portions 100 and 101 indicate the areas where through-hole lands 102 and via lands 103 are formed, respectively.

Via conductors for power supply 22-2 need not be formed directly above through-hole conductors for power supply 20-2. And, the number of through-hole conductors for power supply and the number of via conductors for power supply need not be the same. The less the number of via conductors for power supply is, the less the number of the opening portions 100 provided on the upper electrodes 14 can be.

Via conductors for ground 22-3 need not be formed directly above through-hole conductors for ground 20-3. And, the number of through-hole conductors for ground and the number of via conductors for ground need not be the same. The less the number of via conductors for ground is, the less the number of the opening portions 101 provided on the lower electrodes 18 can be.

When the surface of the silicon substrate 12 is properly polished, it has a property such that the surface is extremely smooth. In addition, if the surface smoothness level required in the present embodiment is satisfied, a glass substrate or a polyimide substrate may be used in lieu of a silicon substrate.

The through-hole conductors and via conductors 20-1, 22-1 of the interposer 10 (see FIG. 3) are conductors for signal, transmitting signals between a semiconductor chip (see FIGS. 4 and 5) and a package substrate (see FIGS. 4 and 5), as described below.

The through-hole conductors for ground 20-3 are connected to the through-hole lands 102 formed in the opening portions 101 of the lower electrodes 18, and, further, connected to the upper electrodes 14 via via conductors for ground 22-3. The through-hole lands 102 are insulated from the lower electrodes 18 by the clearances 25. The through-hole conductors for power supply 20-2 are connected to the lower electrodes 18, and, further, to the via lands 103 provided in the opening portions 100 of the upper electrodes 14 via the via conductors for power supply 22-2. And the via lands 103 and the upper electrodes 14 are insulated from each other by the clearance 24.

And, alternately, the through-hole conductors for power supply 20-2 are connected to the through-hole lands 102 formed in the opening portions 101 of the lower electrodes 18, and, further, may be connected to the upper electrodes 14 via via conductors for power supply 22-2. And the through-hole conductors 20-3 are connected to the lower electrodes 18, and, further, may be connected to the via lands 103 provided in the opening portions 100 of the upper electrodes 14.

The upper electrodes 14 and the lower electrodes 18 are formed of suitable metals. In the present embodiment, the upper electrodes 14 are formed of nickel (Ni), for example, and the lower electrodes 18 are formed of platinum (Pt), for example, for the convenience of production. However, they may be formed of other metals.

The dielectric layer 16 is preferably of a high dielectric substance. The dielectric layer 16 is formed of barium titanate (BaTi03) having ferroelectricity, for example.

Here, the upper electrodes 14, the dielectric layer 16, and the lower electrodes 18 form the capacitor 15.

The interposer 10 illustrated in FIG. 1 is placed, as described below, between a semiconductor chip (see FIGS. 4 and 5) and a package substrate (also referred to as a "mounting substrate") (see FIGS. 4 and 5). The interposer 10 is placed very close to the semiconductor chip to form a decoupling capacitor between a power supply and the ground to absorb noise.

The interposer 10 illustrated in FIG. 1 is such that the dielectric layer 16 is formed on nearly the entire face of one face of the silicon substrate 12 such that the conductor layers on both faces interposing this dielectric layer constitute the upper and lower electrodes 14, 18.

The interposer 10 illustrated in FIG. 1 does not have the signal wiring in the regions in which the capacitor 15 is formed. Accordingly, the electrodes for the capacitors 14, 18 spreading over the surface of the silicon substrate 12 to have a large area can be formed.

Since the surface of the interposer 10 illustrated in FIG. 1 is extremely smooth, the dielectric layer 16 can be formed very thin, namely, the upper electrodes 14 and the lower electrodes 18 can be formed such that the gap therebetween is very narrow.

For the dielectric layer 16 used for the interposer 10 illustrated in FIG. 1, a barium titanate (BaTiO3) layer being of ferroelectricity can be used.

The interposer 10 illustrated in FIG. 1 can, by employing at least one of these features, form a capacitor (condenser) having a very large capacity.

Figure 2:
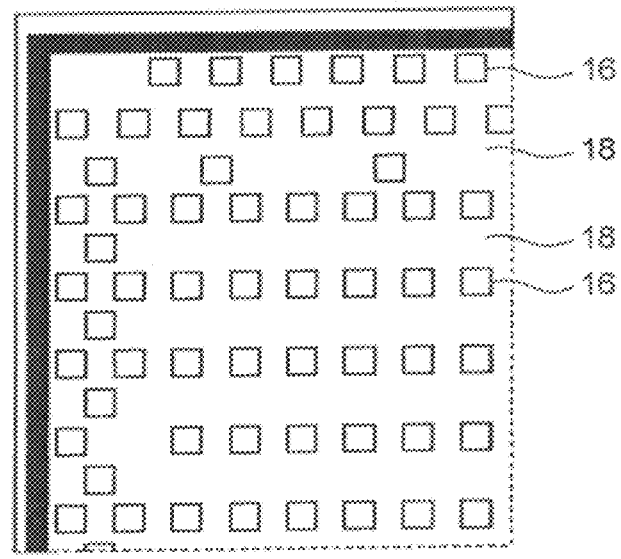
FIG. 2.

FIG. 2 is a view of a portion of the capacitor 15 formed on the interposer 10 illustrated in FIG. 1 as viewed from the side of the lower electrodes 18. In FIG. 2 the area shown in white illustrates the lower electrodes 18 and the box shapes shown in black illustrate the dielectric layer 16 seen from the opening portions of the lower electrodes 18. It shows that the lower electrodes are formed on nearly the entire face of the silicon substrate area.

Figure 3:
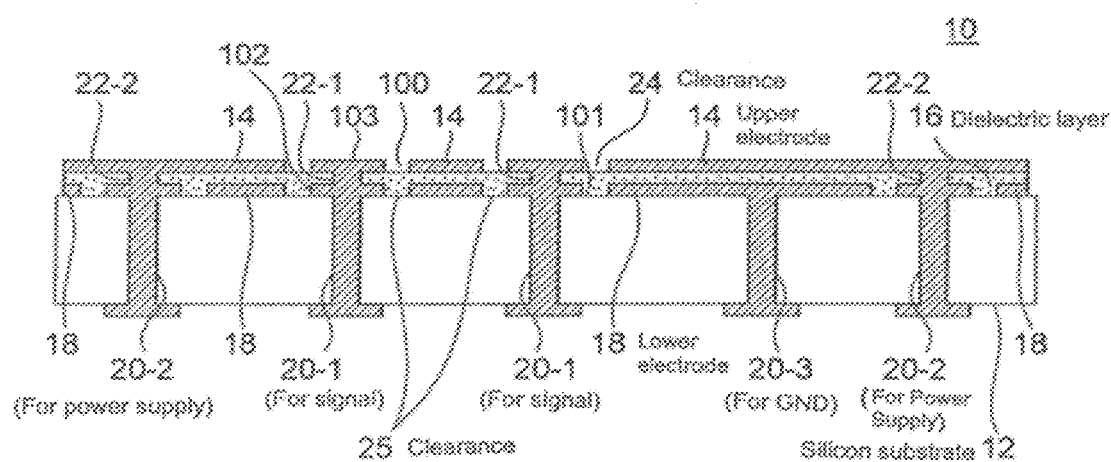
FIG. 3.

FIG. 3 is a sectional view illustrating a feature of an interposer pertaining to another embodiment. As to the feature of the interposer in the above-described FIG. 1, the through-hole conductors for signal and via conductors for signal 20-1, 22-1 are disposed on a peripheral region of the silicon substrate 12 and the through-hole conductors for power supply and via conductors for power supply 20-2, 22-2 as well as the through-hole conductors for ground and via conductors for ground 20-3, 22-3 being disposed on the central region of the silicon substrate 12 to form the capacitors 15. As opposed to this, the feature of the interposer illustrated in FIG. 3 differs in that the through-hole conductors for signal and via conductors for signal 20-1, 22-1 are disposed such that they are concentrated on the central region while the through-hole conductors for power supply and via conductors for power supply 20-2, 22-2 as well as the through-hole conductors for ground and via conductors for ground 20-3, 22-3 are disposed on the peripheral region such that they surround them.

As illustrated in FIG. 3, as to the via conductors for power supply 22-2, the land portions thereof extend to form the upper electrodes 14. And, the through-hole lands 102 are formed in the opening portions 101 of the lower electrodes 18 and insulated from the lower electrodes 18 by the clearance 25. The through-hole conductors for signal and via conductors 20-1, 22-1 are insulated from the upper electrodes 14 by the clearances 24 and insulated from the lower electrodes 18 by the clearance 25. As to the through-hole conductors for ground 20-3, the land portions thereof extend to form the lower electrodes 18, and are being disconnected from the upper electrodes 14. They are electrically being disconnected from the upper electrodes 14 by via conductors connected to the upper electrodes 14 not being formed, for example, or by the clearance 24 by via lands 103 being formed in the opening portions 100 of the upper electrodes 14.

In addition, the through-hole conductors and via conductors for signal 20-1, 22-1, the through-hole conductors and via conductors for power supply 20-2, 22-2, and the through-hole conductors and via conductors for ground 20-3, 22-3 may be disposed in mixture.

Figure 4:
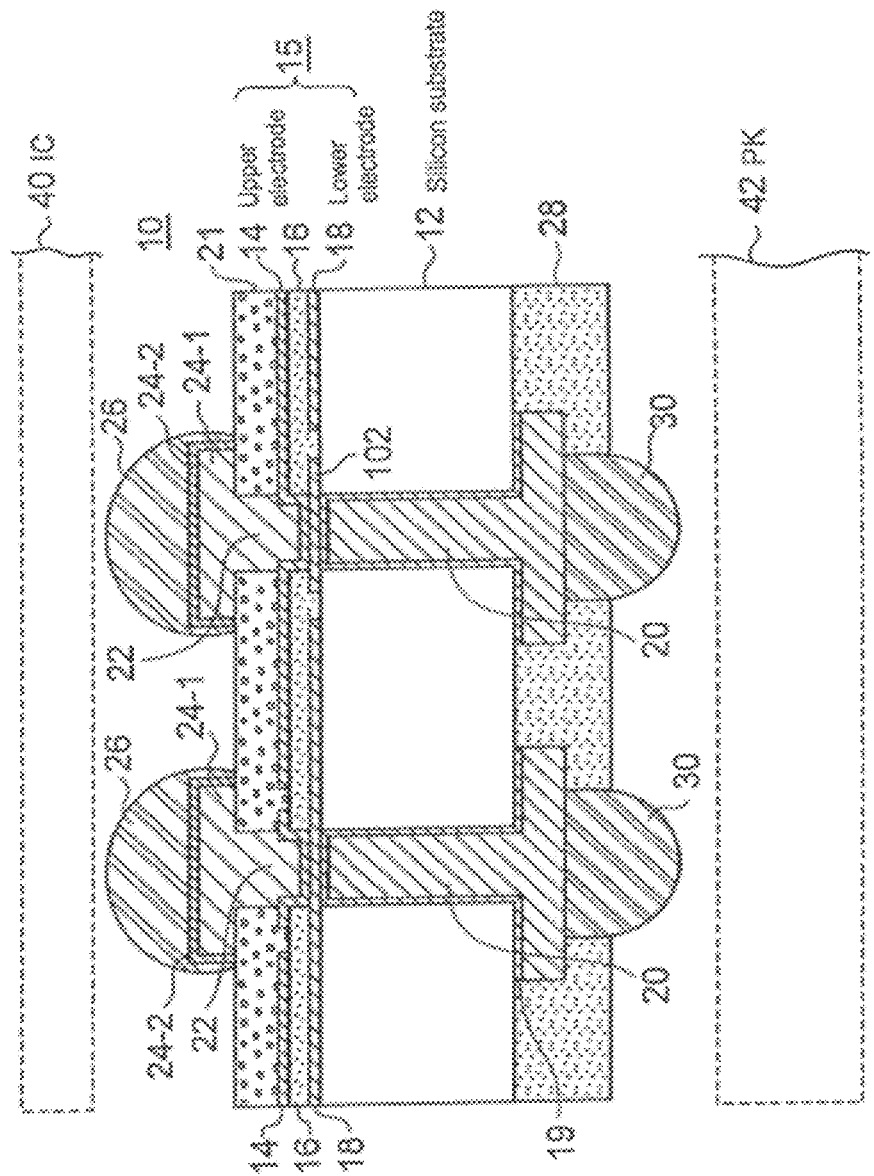
FIG. 4.

FIG. 4 is a sectional view illustrating the constitution of an electronic device using the interposer 10. The interposer 10 is interposed between the IC chip (IC) 40 and the package substrate (PK) 42 and is solder-connected to the IC chip 40 through the solder bump 26 and to the package substrate 42 through the solder bump 30, respectively.

The interposer 10 illustrated in FIG. 4 comprises, in addition to the upper electrodes 14, the dielectric layer 16, the lower electrodes 18, the silicon substrate 12, and the through-hole conductors and via conductors 20, 22, as described in conjunction with FIGS. 1 and 3, the insulating resin layer 21 formed on the upper electrodes 14, the nickel (Ni) lands connected to the through-hole conductors via the opening portions of this insulating resin layer, the gold (Au)-plated layer 24-2 covering these nickel lands (pads), the solder bumps formed on the gold-plated layer, the solder resist layer 28 formed on the lower face of the silicon substrate 12 and the solder bumps 30 formed on the land (external electrodes) portions of the through-hole conductors 20 via the opening portions of this solder resist layer.

The interposer 10 in FIG. 4 is such that since the capacitor 15 is placed very close to the semiconductor chip 40, a decoupling capacitor can be formed between a power supply and the ground to absorb noise.

The interposer 10 in FIG. 4 is such that since there are present no rewiring patterns occupying the surface of the silicon substrate 12, the capacitor electrodes 14, 18 having a large area can be formed.

The interposer 10 in FIG. 4 is such that since the surface of the silicon substrate 12 is extremely smooth, the gap between the upper electrodes 14 and the lower electrodes 18 can be made very narrow.

The interposer 10 in FIG. 4 is such that since a dielectric substance having ferroelectricity can be employed as the dielectric layer 16, a capacitor (condenser) having a very large capacity can be formed.

Figure 5:
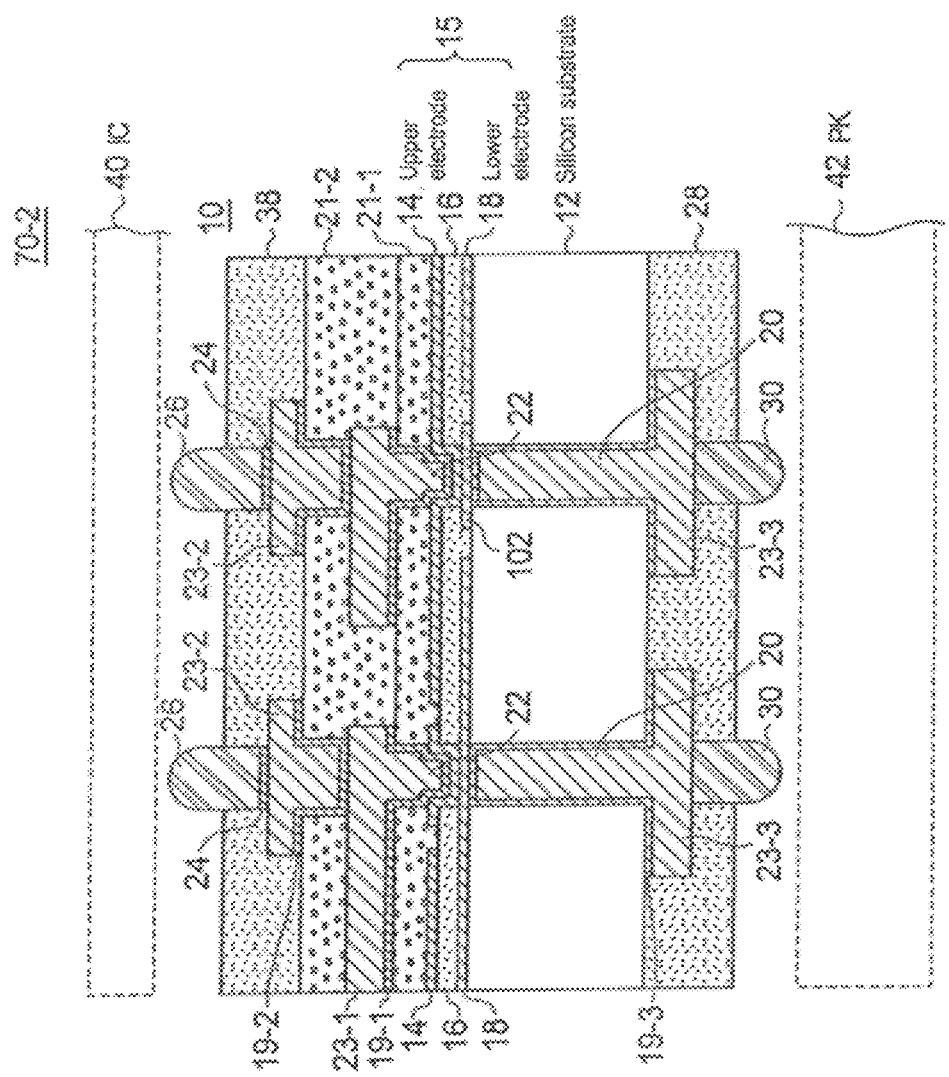
FIG. 5.

FIG. 5 is a sectional view illustrating the constitution of an electronic device using another interposer 10. The constitution of the interposer illustrated in FIG. 5 differs, as compared to that in FIG. 4, in that rewiring layers 23-1, 23-2 are added.

The interposer 10 illustrated in FIG. 5 includes, in addition to the upper electrodes 14, the dielectric layer 16, the lower electrodes 18, the silicon substrate 12, the through-hole conductors 20, via conductors 22, the solder bumps 26, the solder resist layer 28, and the solder bumps 30, as described in conjunction with FIG. 4, the lower side interlaminar insulating resin layer 21-1 whereon the rewiring pattern 23-1 is formed, the upper side interlaminar insulating resin layer 21-2 whereon the rewiring pattern 23-2 is formed, and the solder resist layer 38. The lower side interlaminar insulating resin layer 21-1 is formed on the capacitor. The rewiring pattern 23-1 formed on the lower side interlaminar insulating resin layer is connected to either of the through-hole conductors for signal 20-1, the through-hole conductors for power supply 20-2, and the through-hole conductors for ground 20-3 illustrated in FIG. 1 via the via-hole conductors 22 formed on the lower side interlaminar insulating layer. The interlaminar layers may be one layer or a plurality of layers.

However, these rewiring patterns 23-1, 23-2 are formed on the layers other than the capacitor (namely, the interlaminar insulating resin layers 21-1, 21-2) respectively. That is, there are no rewiring patterns present in the capacitors 15 comprising the upper electrodes 14, the dielectric layer 16, and the lower electrodes 18. Accordingly, capacitor electrodes having a large area can still be formed.

Therefore, the interposer 10 illustrated in FIG. 5 possesses the functions and features of the interposer described in conjunction with FIG. 1 and FIG. 3. The interposer 10 in FIG. 5 is such that since it is placed very close to the semiconductor chip 40, in addition to the interconnection function between the semiconductor chip 40 and the package substrate 42, a decoupling capacitor can be formed between a power supply and the ground to absorb noise.

The interposer 10 in FIG. 5 is such that since no rewiring patterns are present on the portions of the capacitor 15, the capacitor electrodes having a large area can be formed.

The interposer 10 in FIG. 5 is such that the capacitor 15 is formed on the silicon substrate 12 having a very smooth surface. The thickness of the dielectric layer can be made very thin.

The interposer 10 in FIG. 5 is such that since a dielectric substance having ferroelectricity can be employed as the dielectric layer 16, a capacitor (condenser) having a very large capacity can be formed.

Manufacturing Method:

FIG. 6A through FIG. 6M, FIG. 7A through FIG. 7N, and FIG. 8A through FIG. 8J are views illustrating one example of the manufacturing process for the interposer illustrated in FIG. 5. Here, the process shown in FIG. 6A through FIG. 6M is by and large a process for manufacturing the capacitors 15 on the silicon substrate 12. The process shown in FIG. 7A through FIG. 7N is by and large a process for forming the rewiring layers on the upper side of these capacitors 15. Further, the process shown in FIG. 8A through FIG. 8J is by and large a process for forming the through-hole conductors 20 on the silicon substrate 12. However, the manufacturing process for the interposer 10 is not limited to this. In the end, any manufacturing method to bring about the interposer 10 such as the one illustrated in FIG. 4 or 5 can be employed.

Figure 6A:
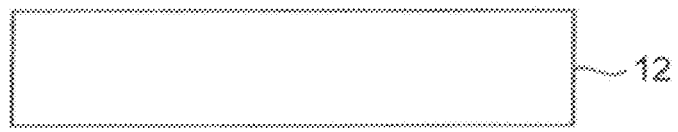
FIG. 6A through FIG. 6M.
Figure 7A:
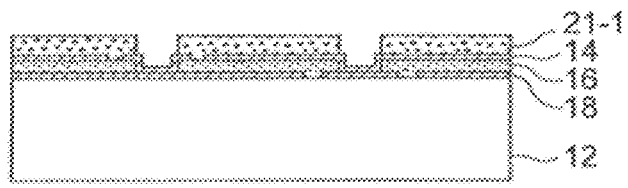
FIG. 7A through FIG. 7N.

FIG. 6A is a step of preparing the silicon (Si) wafer. To give an example, the silicon wafer is of a disk shape being 1 to 3 inches in diameter and 50 to 200 µm in thickness. This silicon wafer corresponds to the silicon substrate 12 of the interposer 10.

Figure 6B:

FIG. 6B is a step of patterning the resist 50 by the lift-off process. To give an example, on the upper face of the silicon substrate 12 a dry film is laminated and patterned.

Figure 6C:
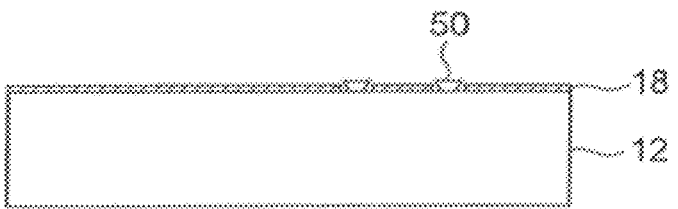

FIG. 6C is a step of forming the lower electrodes 18 by sputtering. A metal layer is deposited by sputtering on the entire surface of the silicon substrate 12 including the top of the resist to form the lower electrodes 18. The lower electrodes 18 are preferably formed of platinum (Pt). However, other metals may be used.

Figure 6D:
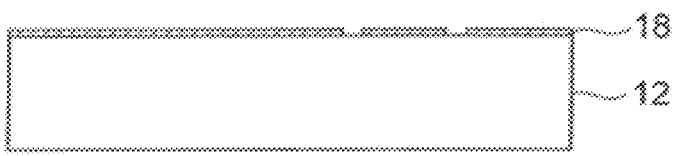

FIG. 6D is a step of stripping the resist 50. The resist 50 patterned at the step of FIG. 5B is stripped with a suitable stripping solution. This being the case, the metal layer deposited on the resist is concurrently stripped such that the lower electrodes 18 are patterned.

Figure 6E:
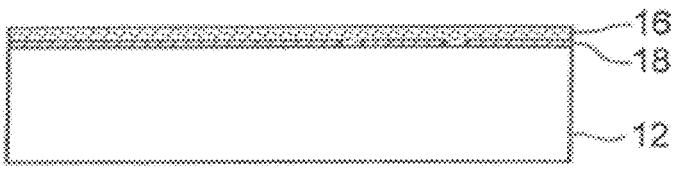

FIG. 6E is a step of forming the dielectric layer 16 by sputtering or sol-gel. The dielectric layer 16 is made of barium titanate (BaTiOx) having ferroelectricity. To illustrate, it is carried out such that on a magnetron sputter apparatus a target of BaTiOx is placed and the first sputter film of about 0.25 µm in film thickness is formed, that there is formed a sol-gel film by a sol-gel solution containing barium (Ba) and Titanium (Ti) being spin-coated multiple times on the first sputter film, and, further, that the second sputter film of about 0.15 µm in film thickness (as with the first sputter film formation) is formed on this spin-coated film. The dielectric layer 16 formed accordingly is such that a sol-gel film is interposed between the first sputter film and the second sputter film.

Figure 6F:
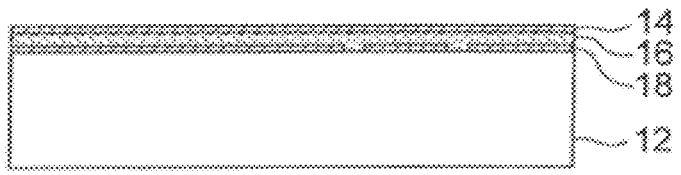

FIG. 6F is a step of forming the upper electrodes 14 by sputtering. The upper electrodes 14 are preferably formed of nickel (Ni). However, other metals may be used.

Figure 6G:
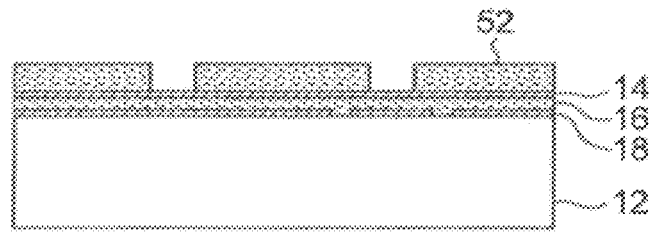

FIG. 6G is a step of patterning the resists 52 to be use to form the upper electrodes 14. As for the resists 54, Dry Film Resist AQ series, etc., made by Asahi Kasei Electronics Co., Ltd. of Tokyo, for example, may be used.

Figure 6H:
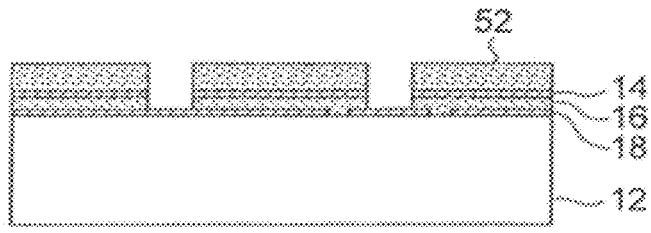

FIG. 6H is a step of etching the upper electrodes 14 and the dielectric layer 16. When the upper electrodes 14 are formed of nickel (Ni), Item Number Melstrip (mixed acid), for example, made by Meltex Inc. can be used as an etchant. When through holes are formed in the dielectric layer 16, CO2 laser or UV laser can be used.

Figure 6I:
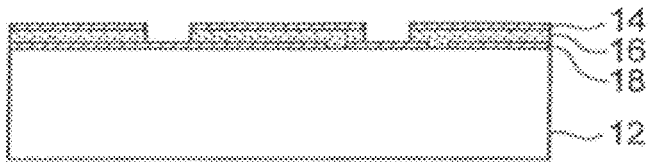

FIG. 6I is a step of stripping the resists 52. For a resist stripper, NaOH aqueous solution of about 10% concentration, for example, can be used.

Figure 6J:
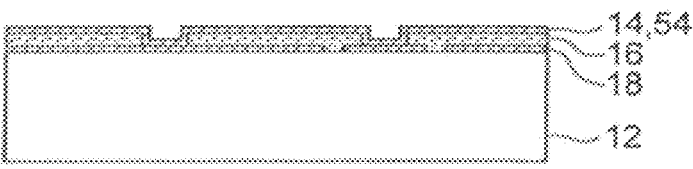

FIG. 6J is a step of forming the seed layer 54 by sputtering. As the seed layer 54, nickel (Ni), for example, can be used.

Figure 6K:
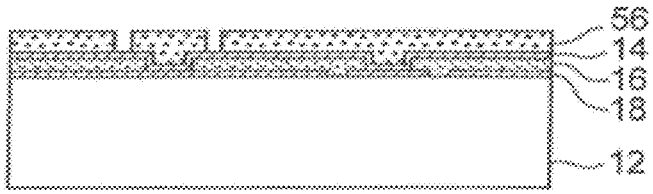

FIG. 6K is a step of patterning the resists 56 to be use to form the upper electrodes 14. As for the resists 56, Dry Film Resist AQ series, etc., made by Asahi Kasei Electronics Co., Ltd. of Tokyo, Japan, for example, may be used.

Figure 6L:
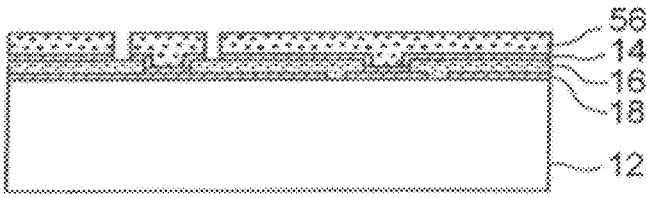

FIG. 6L is a step of etching to form the upper electrodes 14. When the upper electrodes 14 are formed of nickel (Ni), the above-described Item Number Melstrip (mixed acid), for example, is used as an etchant and the nickel (Ni) layer is etched through the opening portions of the resists 56.

Figure 6M:
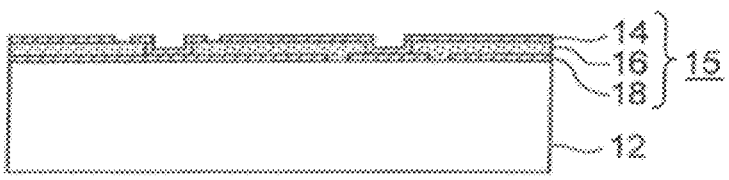

FIG. 6M is a step of stripping the resists 56. For a resist stripper, the above-describe Dry Film Resist AQ series, for example, can be used. Through the steps illustrated in these FIG. 6A through FIG. 6M, the capacitors 15 can be formed on the silicon substrate 12. Via conductors, through-hole lands, and via lands can also be formed.

FIG. 7A is a step of forming and patterning the lower side interlaminar insulating resin layer 21-1. The lower side interlaminar insulating resin layer 21-1 can be formed of polyimide, for example.

Figure 7B:
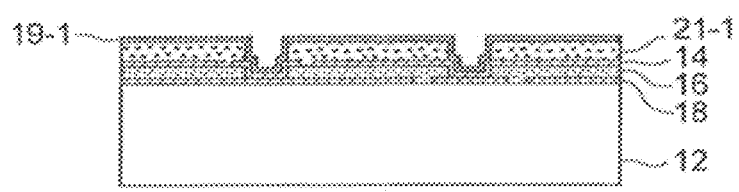

FIG. 7B is a step of forming by sputtering the seed layer 19-1 on the lower side interlaminar insulating resin layer 21-1 patterned. For the see layer 19-1, with nickel (Ni) as the substrate, copper (Cu) can be used on top thereof.

Figure 7C:
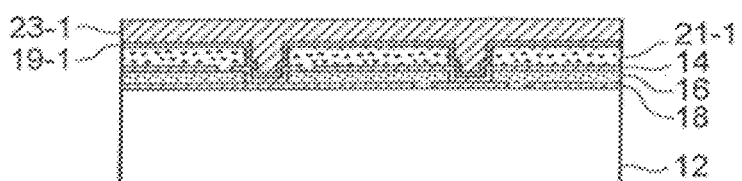

FIG. 7C is a step of forming the copper-plated layer 23-1. For the copper-plated layer 23-1, an electrolysis copper plating is formed on the surface of and on the seed layer inside the opening portions of the lower side interlaminar insulating resin layer 21-1 with the seed layer as the electrode. The surface of the copper-plated layer 23-1 is smoothened as necessary.

Figure 7D:
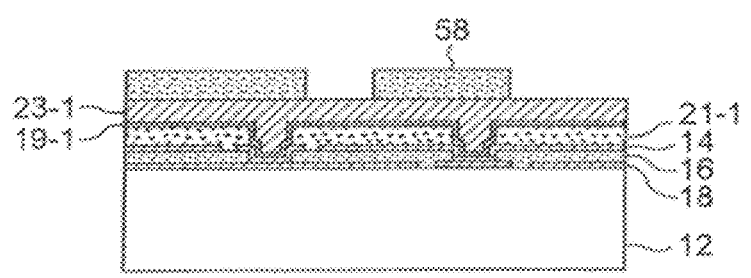

FIG. 7D is a step of patterning the resist 58. To etch the copper-plated layer 23-1, the resist 58 is laminated on the copper-plated layer 23-1 to do the patterning. For the resist 58, the above-described Dry Film Resist AQ series can be used.

Figure 7E:
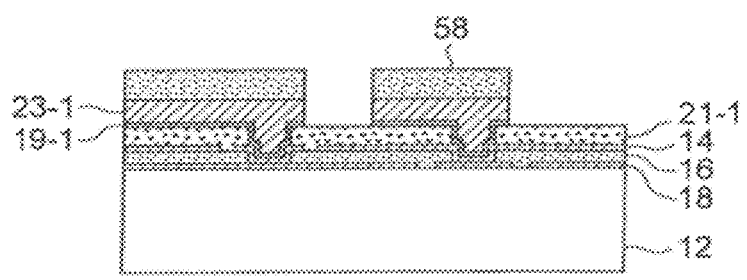

FIG. 7E is a step of etching the copper-plated 23-1 and the seed layer (Cu/Ni) 19-1. When etching a copper-plated layer and the copper layer of a seed layer, the copper-plated layer is etched through the opening portions of the resist with the use of hydrogen peroxide/sulfuric acid (H2S04/H202) as an etchant, for example. When etching the nickel layer of a seed layer, the nickel-plated layer is etched through the opening portions of the resist 58 with the use of the above-described Item Number Melstrip (mixed acid) as an etchant, for example.

Figure 7F:
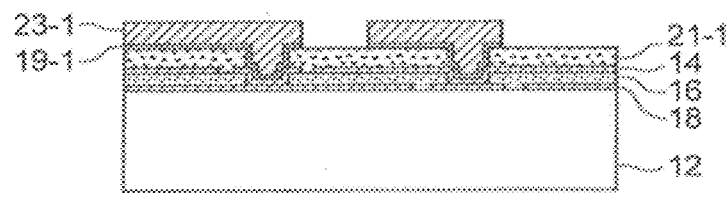

FIG. 7F is a step of stripping the resists 52. For a resist stripper, NaOH aqueous solution of about 10% concentration, for example, can be used.

Figure 7G:
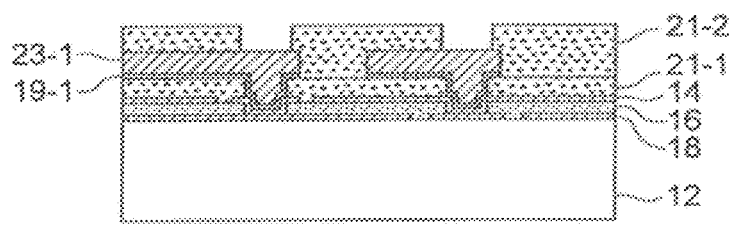

FIG. 7G is a step of forming and patterning the upper side interlaminar insulating resin layer 21-2. As with the step of forming the lower side insulating resin layer 21-1 as illustrated in FIG. 6D, the upper side interlaminar insulating resin layer 21-2 can be formed of polyimide, for example.

Figure 7H:
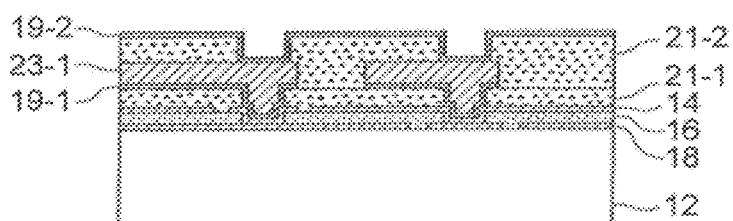

FIG. 7H is a step of forming by sputtering the seed layer 19-2 on the upper side interlaminar insulating resin layer 21-2 patterned. For the see layer 19-2, as in the step illustrated in FIG. 7B, with nickel (Ni) as the substrate, copper (Cu) can be used on top thereof.

Figure 7I:
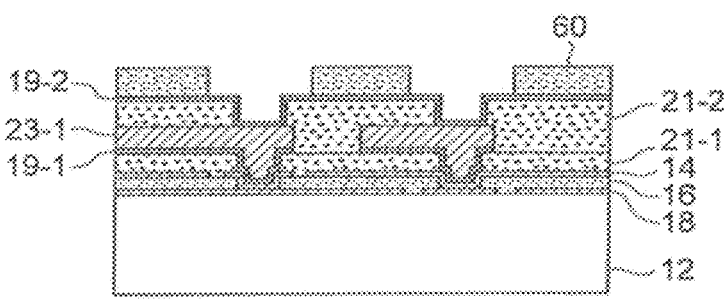

FIG. 7I is a step of patterning the resist 60.

Figure 7J:
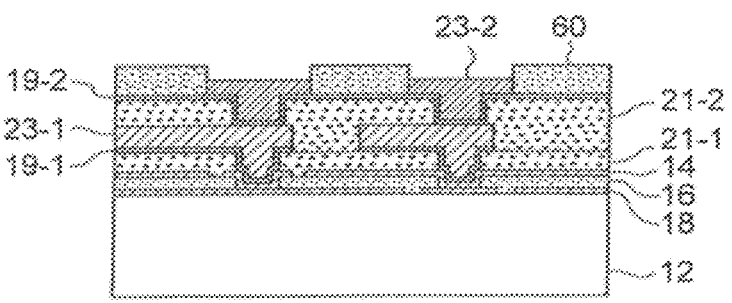

FIG. 7J is a step of forming the copper-plated layer 23-2. For the copper-plated layer 23-2, an electrolysis copper plating is formed on the surface of and on the seed layer 19-2 inside the opening portions of the upper side interlaminar insulating resin layer 21-2 with the seed layer 19-2 as the electrode.

Figure 7K:
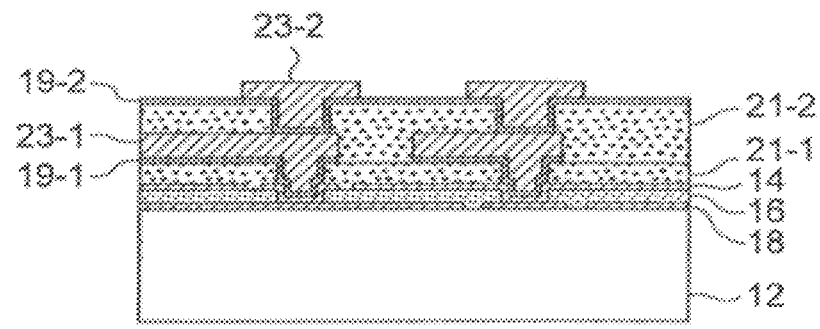

FIG. 7K is a step of stripping the resists 60. For a resist stripper, NaOH aqueous solution of about 10% concentration, for example, can be used.

Figure 7L:
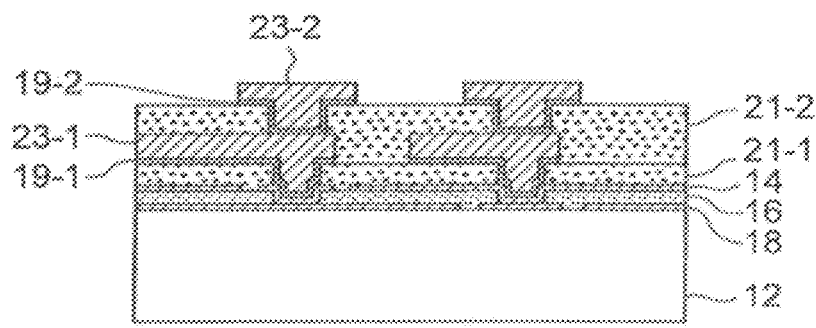

FIG. 7L is a step of etching the copper-plated 23-2 and the seed layer (Cu/Ni) 19-2. As in the step illustrated in FIG. 7E, a copper-plated layer is etched with the use of hydrogen peroxide/sulfuric acid (H2S04/H202) as an etchant and the nickel layer is etched with the use of the above-described Item Number Melstrip (mixed acid), for an example.

Figure 7M:
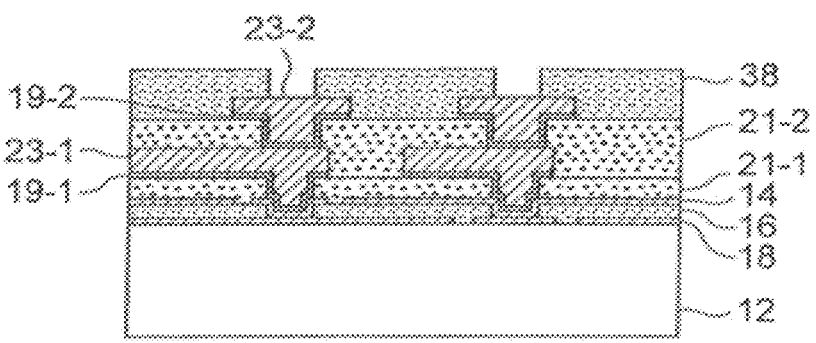
Figure 7N:
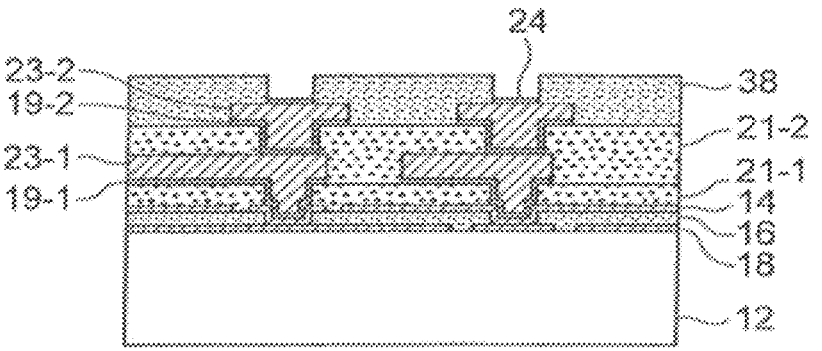

FIG. 7M is a step of patterning the solder resist 38. For the solder resist 38, the coating can be done by screen printing with the use of Item Number SR-7200 (photosensitive liquid solder resist) made by Hitachi Chemicals Co., Ltd. of Tokyo, for example.

FIG. 7N is a step of nickel (Ni)-plating as the undercoat on the copper-plated layer 23-2 and gold (Au)-plating thereon. It is to form the protective layer 24 of the copper-plated layer on the face on which solder bumps are formed to connect to the package. By these FIG. 6 [sic] A through FIG. 6 [sic] N, the rewiring layers 23-1, 23-2 can be formed on the upper face of the capacitor 15.

Figure 8A:
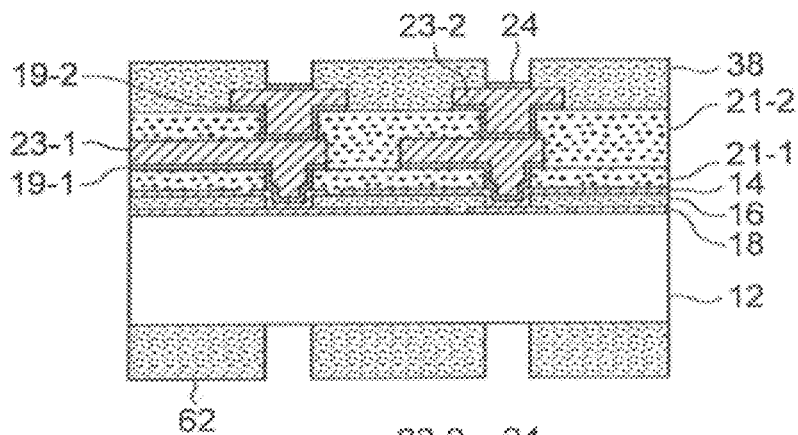
FIG. 8A through FIG. 8J.

FIG. 8A is a step of patterning the resist 62 on the lower face of the silicon substrate 12. To form the through holes 12a in the silicon substrate 12, the resist 62 is laminated on the lower face of the silicon substrate 12 to do the patterning. For the resist 62, the above-described Dry Film Resist AQ series can be used, for example.

Figure 8B:
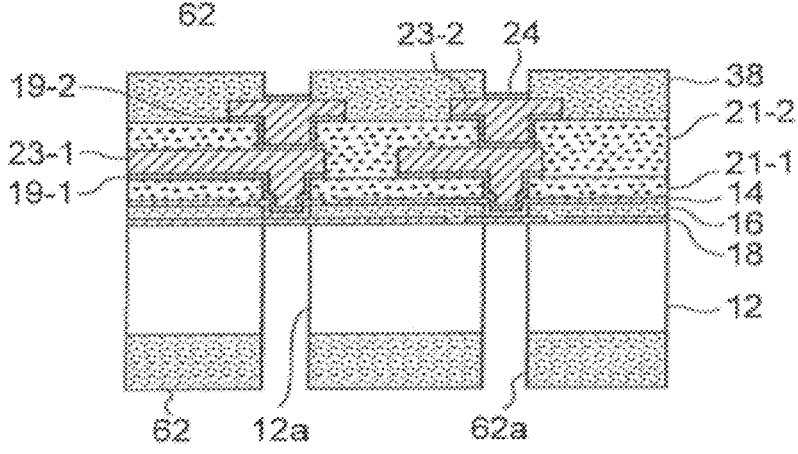

FIG. 8B is a step of forming the through holes 12a in the silicon substrate 12. Through the opening portions 62a formed in the resist 62, the silicon substrate 12 is etched by the anisotropic etching by the RIE process (reactive ion etching) to form the through holes 12a.

Figure 8C:
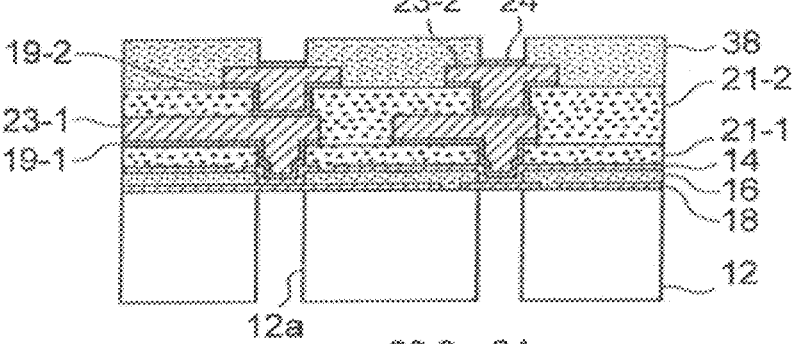

FIG. 8C is a step of stripping the resists 62. For a resist stripper, NaOH aqueous solution of about 10% concentration, for example, can be used.

Figure 8D:
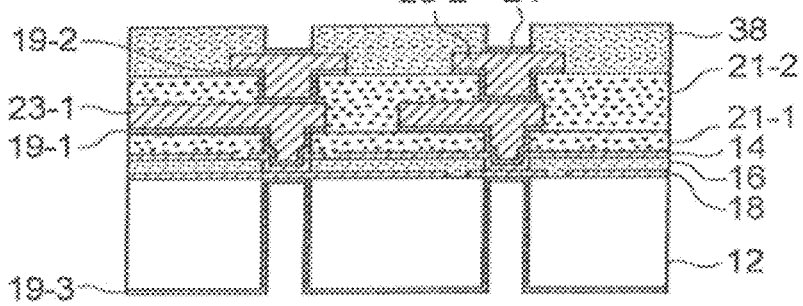

FIG. 8D is a step of forming the seed layer 19-3 by sputtering on the silicon substrate 12 having through holes 12a formed. For the seed layer 19-3, copper (Cu), for example, can be used. Prior to the formation of the seed layer, an insulating layer (SiO$_2$, for example) is formed on the surface of the silicon substrate by CVD method, etc. In addition, as to the order of manufacturing steps, the order may be such that at the stage where the lower electrodes 18 are formed on one face of the silicon substrate (see FIG. 6D) the through holes 12a for through holes are formed (see FIG. 8B) and that an insulating film of SiO$_2$, etc., is formed on the surface of the silicon substrate including the inner walls of the through holes.

Figure 8E:
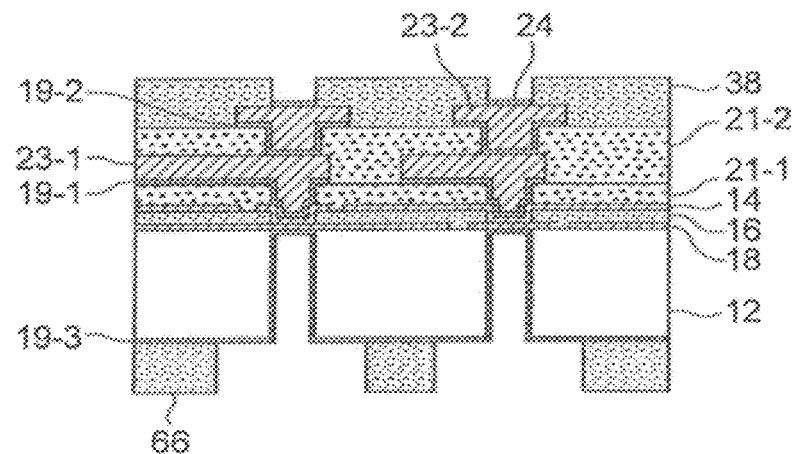

FIG. 8E is a step of patterning the resist 66. On the seed layer 19-3 of the surface of the silicon substrate 12, a dry film is laminated to do the patterning.

Figure 8F:
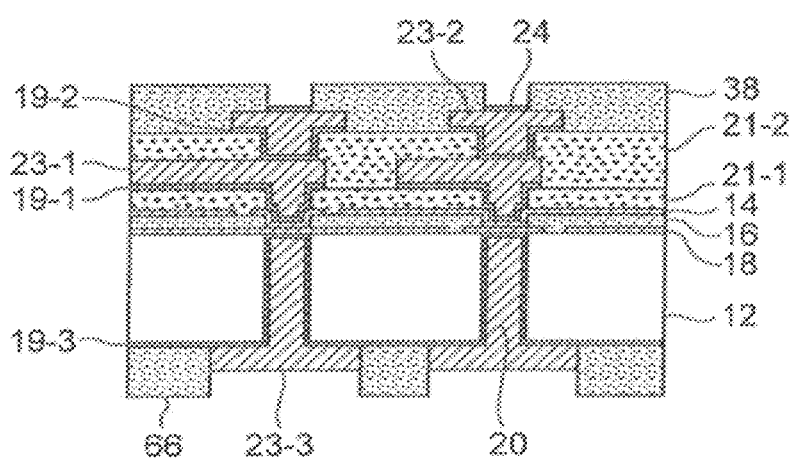

FIG. 8F is a step of forming the copper-plated layer 23-3. For the copper-plated layer 23-3, an electrolysis copper plating is formed on the surface of and on the seed layer 19-3 inside the opening portions of the silicon substrate 12 with the seed layer 19-3 as the electrode.

Figure 8G:
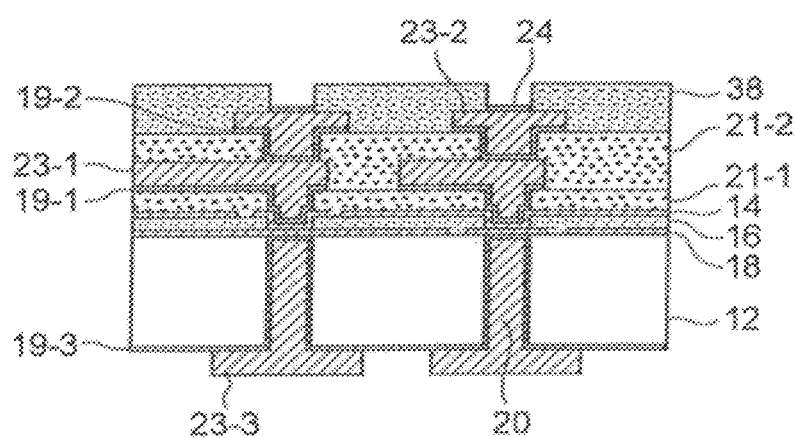

FIG. 8G is a step of stripping the resists 66. For a resist stripper, NaOH aqueous solution of about 10% concentration, for example, can be used.

Figure 8H:
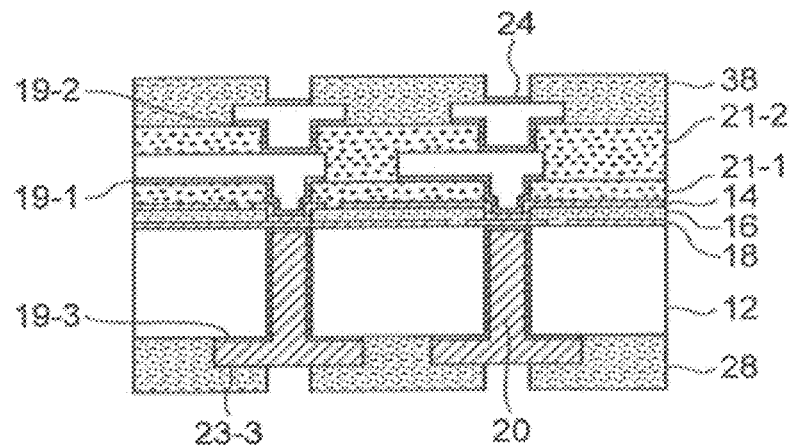

FIG. 8H is a step of etching the seed layer 19-3. When the seed layer 19-3 is formed of copper (Cu), for example, the seed layer can be removed by soft etching with the use of hydrogen peroxide/sulfuric acid (H2S04/H202) as an etchant. In addition, upon etching, suitable resists may be formed on the copper-plated layer 23-3.

Figure 8I:
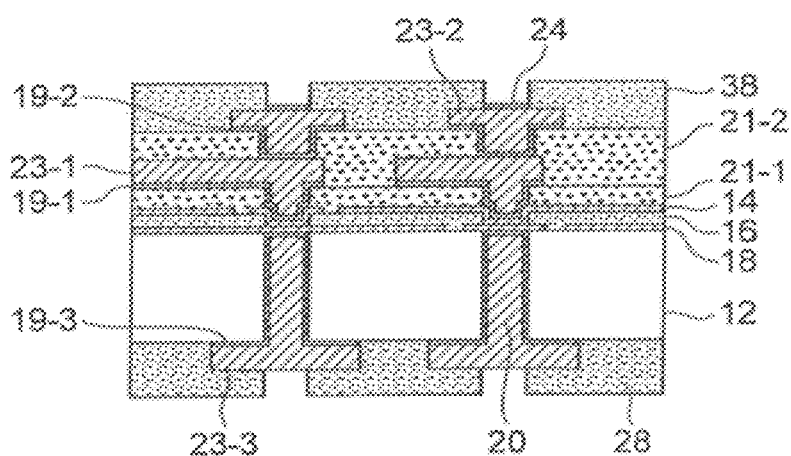

FIG. 8I is a step of patterning the solder resist 28. For the solder resist 28, the coating can be done by screen printing with the use of the above-described Item Number SR-7200 (photosensitive liquid solder resist), for example.

Figure 8J:
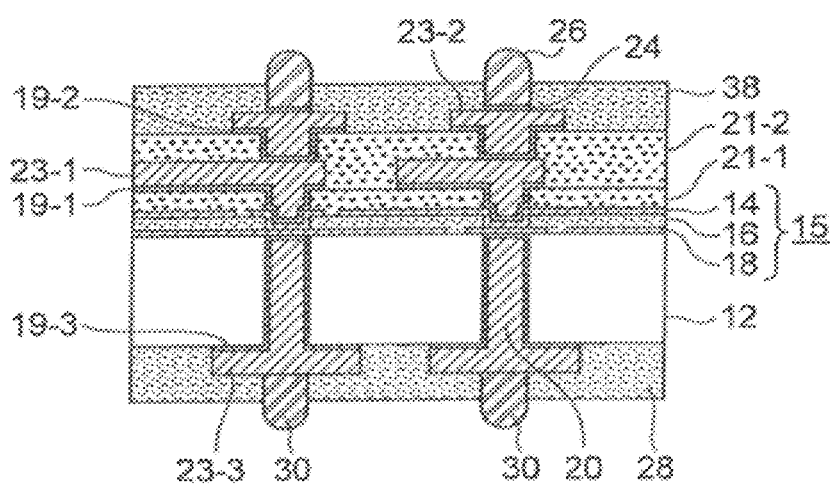

FIG. 8J is a step of forming the solder bumps 26, 30. On the copper-plated layer 23-2 present in the opening portions 38a of the solder resist 38, the solder bumps 26 for the connection to the package are formed, and on the copper-plated layer 23-3 present in the opening portions 28a of the solder resist 28, the solder bumps 30 for the connection to the IC chip are formed. The solder bumps 26, 30 can be formed by screen printing, for example. By these FIG. 8A through FIG. 8J, the through-hole conductors 20 can be formed in the silicon substrate 12.

In addition, the interposers illustrated in FIG. 4 can be manufactured by using a portion of the above-described steps (e.g., FIGS. 6A through 6M, FIG. 7A through FIG. 7F, 8A through 8J).

Electronic Devices Using Interposers:

The interposer illustrated 10 in FIG. 4 is interposed between the IC chip 40 and the package substrate 42 such that it is mutually connected to them separately, constituting an electronic device 70-1 comprising a combination of a semiconductor chip, an interposer, and a package substrate.

This electronic device 70-1 is formed, following the manufacture of the interposer 10, by reflowing the solder bumps 26, 30 such that the interposer 10 is solder-connected to the semiconductor chip 40 and the package substrate 42 separately. The interposer 10 is positioned near the semiconductor 40 and functions as a decoupling capacitor having a large capacity.

The interposer illustrated 10 in FIG. 5 is interposed between the IC chip 40 and the package substrate 42 such that it is mutually connected to them separately, constituting an electronic device 70-2 comprising a combination of a semiconductor chip, an interposer, and a package substrate. This electronic device 7-2 is formed, following the manufacture of the interposer 10, by reflowing the solder bumps 26, 30 such that the interposer 10 is solder-connected to the semiconductor chip 40 and the package substrate 42 separately. The interposer 10 provides the rewiring layers 23-1, 23-2 between the semiconductor chip 40 and the package substrate 42.

Features, Advantages, etc., of the Embodiments

The interposers 10 pertaining to the present embodiments are such that since there are present no rewiring patterns occupying the surface of the silicon substrate 12, the capacitor electrodes having a large area can be formed.

The interposers 10 pertaining to the present embodiments can form the dielectric layer very thin, namely, the gap between the upper electrodes 14 and the lower electrodes 18 very narrow since a silicon substrate having an extremely smooth surface is used. It results in the capacitor formed on the substrate having a large capacity.

The interposers 10 pertaining to the present embodiments can form a decoupling capacitor having a large capacity on the substrate since a substance having ferroelectricity such as a barium titanate (BaTiO3) layer can be employed.

The electronic devices 70-1 pertaining to the present embodiments can further provide decoupling capacitors having a large capacity extremely near to the semiconductor chip 40 on account of the combination of the semiconductor chip 40, the interposer 10, and a package substrate 42.

The electronic devices 70-2 pertaining the present embodiments can provide, while positioning a decoupling capacitor having a large capacity extremely near to the semiconductor chip 40, the rewiring layers 23-1, 23-2.

Others:

In the above, the embodiments of the interposers and of the electronic devices using it pertaining to the present invention were described, and these are only examples and the present invention is not limited thereto.

For example, the through-hole conductors 20 and the via conductors 22 are longitudinally connected, and generally referred to as through-hole conductors and via conductors 20, 22. However, they are not limited to this. For example, in the interposers illustrated in FIG. 1 and FIG. 3, the through-hole conductors 20 may be such that they are not connected to the lower electrodes 18 by the clearance 25 and that they are connected to the upper electrodes 14 being positioned away from them via the via conductors 22. In this case, the through-hole conductors 20 and via conductors 22 are, while they are electrically connected, not connected longitudinally. Such a set-up may be applicable to either the through-hole conductors for power supply, ground, and signal or the via conductors.

Therefore, the technical scope of the present invention is set forth in accordance with the description of the accompanying claims.

The invention claimed is:

1. An interposer comprising:
   a silicon substrate having a polished surface and a plurality of through holes;
   a capacitor formed on substantially an entire face of the polished surface of the silicon substrate, the capacitor comprising a lower electrode formed on the polished surface of the silicon substrate, a dielectric layer formed on the lower electrode, and an upper electrode formed on the dielectric layer,
   a plurality of through-hole conductors formed through the silicon substrate and electrically connected to the capacitor, the plurality of through-hole conductors comprising a through-hole conductor for signal, a through-hole conductor for power supply, and a through-hole conductor for ground,
   a plurality of through-hole lands which are formed on the polished surface of the silicon substrate and comprise a through-hole land for signal and a through-hole land for ground;
   a plurality of via conductors which are formed through the dielectric layer and comprise a via conductor for signal, a via conductor for power supply, and a via conductur for ground; and
   a plurality of via lands which are formed on the dielectric layer and comprise a via land for signal and a via land for power supply,
   wherein the through-hole conductor for signal is electrically connected to the through-hole land for signal, to the via conductor for signal, and to the via land for signal, the through-hole land for signal is electrically insulated from the lower electrode by a first clearance, the via land for signal is electrically insulated from the upper electrode by a second clearance,
   the through-hole conductor for power supply is electrically connected to the lower electrode, to the via conductor for power supply, and to the via land for power supply the via land for power supply is electrically insulated from the upper electrode by the second clearance,
   the through-hole conductor for ground is electrically connected to the through-hole land for ground, to the via conductor for ground, and to the upper electrode, and the through-hole land for ground is electrically insulated from the lower electrode by the first clearance.

2. The interposer as set forth in claim 1, wherein the through-hole conductor for power supply and the through-hole conductor for ground are formed in a central region of the silicon substrate, and the through-hole conductor for signal is formed in a peripheral region of the silicon substrate.

3. The interposer as set forth in claim 1, wherein the through-hole conductors and the via conductors are made of copper.

4. The interposer as set forth in claim 1, wherein the upper electrode and the lower electrode are made of nickel or platinum.

5. The interposer as set forth in claim 1, wherein the dielectric layer is made of a ferroelectric substance.

6. The interposer as set forth in claim 1, wherein the dielectric layer is made of barium titanate.

7. The interposer as set forth in claim 1, further comprising a solder resist layer or an insulating resin layer which covers at least one face of the interposer.

8. The interposer as set forth in claim 1, wherein the upper electrode is part of a plane layer having an opening portion formed therein such that a clearance is formed between the upper electrode and an adjacent conductor, and the lower electrode is part of a plane layer having an opening portion formed therein such that a clearance is formed between the lower electrode and an adjacent conductor.

9. An electronic device comprising:
   an IC chip;
   a package substrate; and
   the interposer as set forth in claim 1,
   wherein the interposer is interposed between the IC chip and the package substrate and electrically connected to each of the IC chip and the package substrate.

10. The interposer as set forth in claim 1, wherein the through-hole conductor for power supply and the through-hole conductor for ground are formed in a peripheral region of the silicon substrate, and the through-hole conductor for signal is formed in a central region of the silicon substrate.

11. An interposer comprising:
    a silicon substrate having a polished surface and a plurality of through holes;
    a capacitor formed on substantially an entire face of the polished surface of the silicon substrate the capacitor comprising a lower electrode formed on the polished surface of the silicon substrate, a dielectric layer formed on the lower electrode, and an upper electrode formed on the dielectric layer;

a plurality of through-hole conductors formed through the silicon substrate and electrically connected to the capacitor, the plurality of through-hole conductors comprising a through-hole conductor for signal, a through-hole conductor for power supply, and a through-hole conductor for ground;

a plurality of through-hole lands which are formed on the polished surface of the silicon substrate and comprise a through-hole land for signal and a through-hole land for power supply;

a plurality of via conductors which are formed through the dielectric layer and comprise a via conductor for signal, a via conductor for power supply, and a via conductor for ground; and a plurality of via lands which are formed on the dielectric layer and comprise a via land for signal and a via land for ground, wherein the through-hole conductor for power supply is electrically connected to the through-hole land for power supply, to the via conductor for power supply, and to the upper electrode, the through-hole land for power supply is electrically insulated from the lower electrode by a first clearance, the through-hole conductor for signal is electrically connected to the through-hole land for signal, to the via conductor for signal, and to the via land for signal, the through-hole land for signal is electrically insulated from the lower electrode by the first clearance, the via land for signal is electrically insulated from the upper electrode by a second clearance, the through-hole conductor for ground is electrically connected to the lower electrode, to the via conductor for ground, and to the via land for ground, and the via land for ground is electrically insulated from the upper by the second clearance.

12. The interposer as set forth in claim 11, wherein the through-hole conductor for power supply and the through-hole conductor for ground are formed in a central region of the silicon substrate, and the through-hole conductor for signal is formed in a peripheral region of the silicon substrate.

13. The interposer as set forth in claim 11, wherein the through-hole conductor for power supply and the through-hole conductor for ground are formed in a peripheral region of the silicon substrate, and the through-hole conductor for signal is formed in a central region of the silicon substrate.

14. The interposer as set forth in claim 11, wherein the through-hole conductors and the via conductors are made of copper.

15. The interposer as set forth in claim 11, wherein the upper electrode and the lower electrode are made of nickel or platinum.

16. The interposer as set forth in claim 11, wherein the dielectric layer is made of a ferroelectric substance.

17. The interposer as set forth in claim 11, wherein the dielectric layer is made of barium titanate.

18. The interposer as set forth in claim 11, further comprising a solder resist layer or an insulating resin layer which covers at least one face of the interposer.

19. The interposer as set forth in claim 11, wherein the lower electrode is part of a plane layer having an opening portion formed therein such that a clearance is formed between the lower electrode and an adjacent conductor, and the upper electrode is part of a plane layer having an opening portion formed therein such that a clearance is formed between the upper electrode and an adjacent conductor.

20. An electronic device comprising:
an IC chip;
a package substrate; and
the interposer as set forth in claim 11,
wherein the interposer is interposed between the IC chip and the package substrate and electrically connected to each of the IC chip and the package substrate.

* * * * *